US012787820B2

(12) United States Patent
Choi

(10) Patent No.: US 12,787,820 B2
(45) Date of Patent: Nov. 3, 2026

(54) SEMICONDUCTOR PACKAGE

(71) Applicant: SAMSUNG ELECTRONICS CO., LTD., Suwon-si (KR)

(72) Inventor: Keunho Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 384 days.

(21) Appl. No.: 18/374,310

(22) Filed: Sep. 28, 2023

(65) Prior Publication Data

US 2024/0312920 A1 Sep. 19, 2024

(30) Foreign Application Priority Data

Mar. 14, 2023 (KR) ........................ 10-2023-0033034

(51) Int. Cl.
*H10W 72/00* (2026.01)
*H10B 80/00* (2023.01)
(Continued)

(52) U.S. Cl.
CPC ............ *H10W 70/65* (2026.01); *H10B 80/00* (2023.02); *H10W 70/611* (2026.01);
(Continued)

(58) Field of Classification Search
CPC ..... H01L 23/5386; H01L 24/16; H01L 25/18; H01L 23/3128; H01L 24/05; H01L 24/06; H01L 24/08; H01L 24/13; H01L 24/17; H01L 24/32; H01L 24/33; H01L 24/73; H01L 2224/0557; H01L 2224/05624; H01L 2224/05647; H01L 2224/05684; H01L 2224/06181; H01L 2224/08145; H01L 2224/08225; H01L 2224/13111; H01L 2224/13139; H01L 2224/13147; H01L 2224/16145; H01L 2224/16227; H01L 2224/1703; H01L 2224/17181;
(Continued)

(56) References Cited

U.S. PATENT DOCUMENTS 9,741,690 B1 * 8/2017 Hsieh .................. H01L 25/0655
10,062,648 B2 8/2018 Hsieh et al.
(Continued)

*Primary Examiner* — Benjamin Tzu-Hung Liu
(74) *Attorney, Agent, or Firm* — Morgan, Lewis & Bockius LLP

(57) ABSTRACT

A semiconductor package includes: a first redistribution structure having a structure including at least one first redistribution layer and at least one first insulating layer; a first semiconductor chip disposed on the first redistribution structure; a second semiconductor chip disposed on the first redistribution structure; and bumps disposed between the first redistribution structure and the first semiconductor chip and between the first redistribution structure and the second semiconductor chip, wherein the at least one first redistribution layer includes a detour redistribution line disposed so that a portion of the detour redistribution line overlaps a space between the first and second semiconductor chips, and the detour redistribution line circuitously extends across the space between the first and second semiconductor chips so as not to overlap a stress concentration region partially overlapping a portion of the space between the first and second semiconductor chips, or extends into the stress concentration region.

20 Claims, 12 Drawing Sheets

(51) Int. Cl.

| | |
|---|---|
| ***H10W 70/60*** | (2026.01) |
| ***H10W 70/65*** | (2026.01) |
| ***H10W 72/20*** | (2026.01) |
| ***H10W 72/30*** | (2026.01) |
| ***H10W 72/90*** | (2026.01) |
| ***H10W 90/00*** | (2026.01) |
| *H10W 74/10* | (2026.01) |
| *H10W 74/15* | (2026.01) |

(52) U.S. Cl.

CPC ......... *H10W 72/347* (2026.01); *H10W 90/00* (2026.01); *H10W 72/07252* (2026.01); *H10W 72/07254* (2026.01); *H10W 72/07352* (2026.01); *H10W 72/07354* (2026.01); *H10W 72/227* (2026.01); *H10W 72/247* (2026.01); *H10W 72/252* (2026.01); *H10W 72/327* (2026.01); *H10W 72/877* (2026.01); *H10W 72/942* (2026.01); *H10W 72/944* (2026.01); *H10W 72/952* (2026.01); *H10W 74/117* (2026.01); *H10W 74/15* (2026.01); *H10W 90/722* (2026.01); *H10W 90/724* (2026.01); *H10W 90/732* (2026.01); *H10W 90/734* (2026.01); *H10W 90/792* (2026.01); *H10W 90/794* (2026.01)

(58) Field of Classification Search

CPC . H01L 2224/32145; H01L 2224/32225; H01L 2224/3303; H01L 2224/33181; H01L 2224/73204; H01L 2224/73253; H01L 2924/014; H01L 2924/1431; H01L 2924/1432; H01L 2924/1433; H01L 2924/1436; H01L 2924/1437; H01L 2924/1438; H10B 80/00; H10W 70/65; H10W 70/611; H10W 90/00; H10W 72/07252; H10W 72/07254; H10W 72/07352; H10W 72/07354; H10W 72/227; H10W 72/247; H10W 72/252; H10W 72/327; H10W 72/347; H10W 72/877; H10W 72/942; H10W 72/944; H10W 72/952; H10W 74/117; H10W 74/15; H10W 90/722; H10W 90/724; H10W 90/732; H10W 90/734; H10W 90/792; H10W 90/794

See application file for complete search history.

(56) References Cited

U.S. PATENT DOCUMENTS

| | | | | |
|---|---|---|---|---|
| 10,109,617 | B2 * | 10/2018 | Lee ........................ | H10W 42/20 |
| 10,304,801 | B2 | 5/2019 | Huang et al. | |
| 10,366,953 | B2 | 7/2019 | Chen et al. | |
| 11,315,863 | B2 | 4/2022 | Choi | |
| 2014/0374893 | A1 | 12/2014 | Choi | |
| 2020/0051897 | A1 | 2/2020 | Huang | |
| 2022/0068896 | A1 | 3/2022 | Kwon | |
| 2023/0387031 | A1 * | 11/2023 | Yang ..................... | H10W 70/05 |

* cited by examiner

I2-I2'

I2-I2'

SEMICONDUCTOR PACKAGE

CROSS-REFERENCE TO RELATED APPLICATION

This application claims priority under 35 U.S.C. § 119 to Korean Patent Application No. 10-2023-0033034, filed on Mar. 14, 2023, in the Korean Intellectual Property Office, the disclosure of which is incorporated by reference herein in its entirety.

TECHNICAL FIELD

The present inventive concept relates to a semiconductor package.

DISCUSSION OF THE RELATED ART

In general, a semiconductor chip may be implemented as a semiconductor package such as a wafer level package (WLP) or a panel level package (PLP), and the semiconductor package may be used as an electronic component of a device.

The semiconductor package may generally include a redistribution layer for electrically connecting a semiconductor chip to a device or a printed circuit board. Typically, the redistribution layer may have a structure in which a redistribution line, which is realized more finely than an interconnection of an interconnection layer of a general printed circuit board, is extended horizontally.

The redistribution layer may be electrically connected to bumps and may vertically extend an electrical connection path, and under bump metallurgy (UBM) may increase electrical connection efficiency between the redistribution layer and the bumps.

As a system that can be provided by a semiconductor chip becomes increasingly complex and performance of the semiconductor chip gradually increases, a volume and load of the semiconductor chip are gradually increasing. Accordingly, a degree of difficulty in securing the reliability of the semiconductor package is also increasing.

SUMMARY

According to an example embodiment of the present inventive concept, a semiconductor package includes: a first redistribution structure having a structure in which at least one first redistribution layer and at least one first insulating layer are alternately stacked on each other; a first semiconductor chip disposed on the first redistribution structure; a second semiconductor chip disposed on the first redistribution structure; and bumps disposed between the first redistribution structure and the first semiconductor chip and between the first redistribution structure and the second semiconductor chip, wherein the at least one first redistribution layer includes a detour redistribution line disposed so that a portion of the detour redistribution line overlaps a space between the first and second semiconductor chips, and the detour redistribution line circuitously extends across the space between the first and second semiconductor chips so as not to overlap a stress concentration region partially overlapping a portion of one flank of the space between the first and second semiconductor chips, or extends into the stress concentration region.

According to an example embodiment of the present inventive concept, a semiconductor package includes: a first redistribution structure having a structure in which at least one first redistribution layer and at least one first insulating layer are alternately stacked on each other; a first semiconductor chip disposed on the first redistribution structure; a second semiconductor chip disposed on the first redistribution structure; a second redistribution structure having a structure in which at least one second redistribution layer and at least one second insulating layer are alternately stacked on each other; an embedded semiconductor chip disposed between the first and second redistribution structures; conductive vias electrically connecting the first and second redistribution structures to each other; and an encapsulant disposed between the first and second redistribution structures and encapsulating the embedded semiconductor chip, wherein the at least one first redistribution layer includes a detour redistribution line in which a portion of the detour redistribution line overlaps a space between the first and second semiconductor chips, and the detour redistribution line circuitously extends across the space between the first and second semiconductor chips so as not to overlap a stress concentration region partially overlapping a portion of one flank of the space between the first and second semiconductor chips, or extends into the stress concentration region.

According to an example embodiment of the present inventive concept, a semiconductor package includes: a first redistribution structure in which at least one first redistribution layer and at least one first insulating layer are alternately stacked on each other; first semiconductor chips disposed on a first surface of the first redistribution structure and stacked thereon; second semiconductor chips disposed on the first surface of the first redistribution structure and stacked thereon; a second redistribution structure in which at least one second redistribution layer and at least one second insulating layer are alternately stacked on each other; an embedded semiconductor chip disposed between the first and second redistribution structures; conductive vias electrically connecting the first and second redistribution structures to each other; and an encapsulant disposed between the first and second redistribution structures and encapsulating the embedded semiconductor chip, wherein the at least one first redistribution layer includes a detour redistribution line disposed in which a portion of the detour redistribution line overlaps a space between the first semiconductor chips and the second semiconductor chips, the at least one first redistribution layer further includes an additional redistribution line disposed so that a portion of the additional redistribution line overlaps the space between the first semiconductor chips and the second semiconductor chips, and the detour redistribution line and the additional redistribution line are more adjacent to each other in one portion overlapping the space between the first semiconductor chips and the second semiconductor chips than in another other portion that is not overlapping the space between the first and second semiconductor chips.

BRIEF DESCRIPTION OF DRAWINGS

The above and other aspects of the present inventive concept will become more apparent by describing in detail example embodiments thereof, with reference to the accompanying drawings, in which.

DETAILED DESCRIPTION OF THE EMBODIMENTS

Figure 1A:
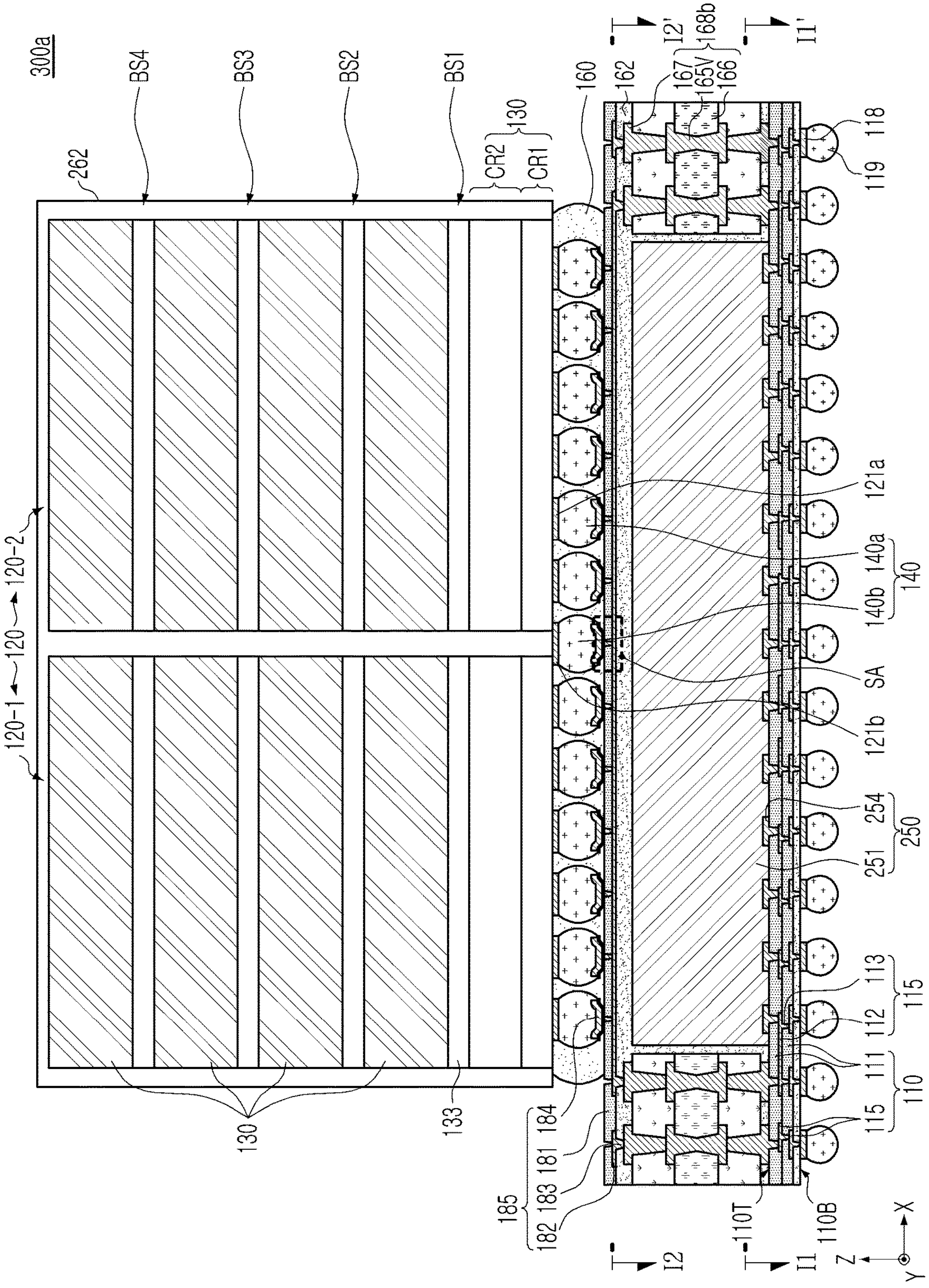
FIGS. 1A, 1B and 1C are cross-sectional views illustrating a semiconductor package according to an example embodiment of the present inventive concept.

Hereinafter, example embodiments of the present inventive concept will be described with reference to the accompanying drawings. It should be understood that the various embodiments of the present inventive concept are different from each other but are not necessarily mutually exclusive. For example, specific shapes, structures, and characteristics described herein may be implemented in one embodiment and in another embodiment without departing from the spirit and scope of the present inventive concept. Additionally, it should be understood that the location or arrangement of individual components within each disclosed embodiment may be changed without departing from the spirit and scope of the present inventive concept. Accordingly, the detailed description set forth below is not to be taken in a limiting sense. Like reference numbers in the drawings indicate the same or similar elements, and thus, their descriptions may be omitted.

Figure 1B:
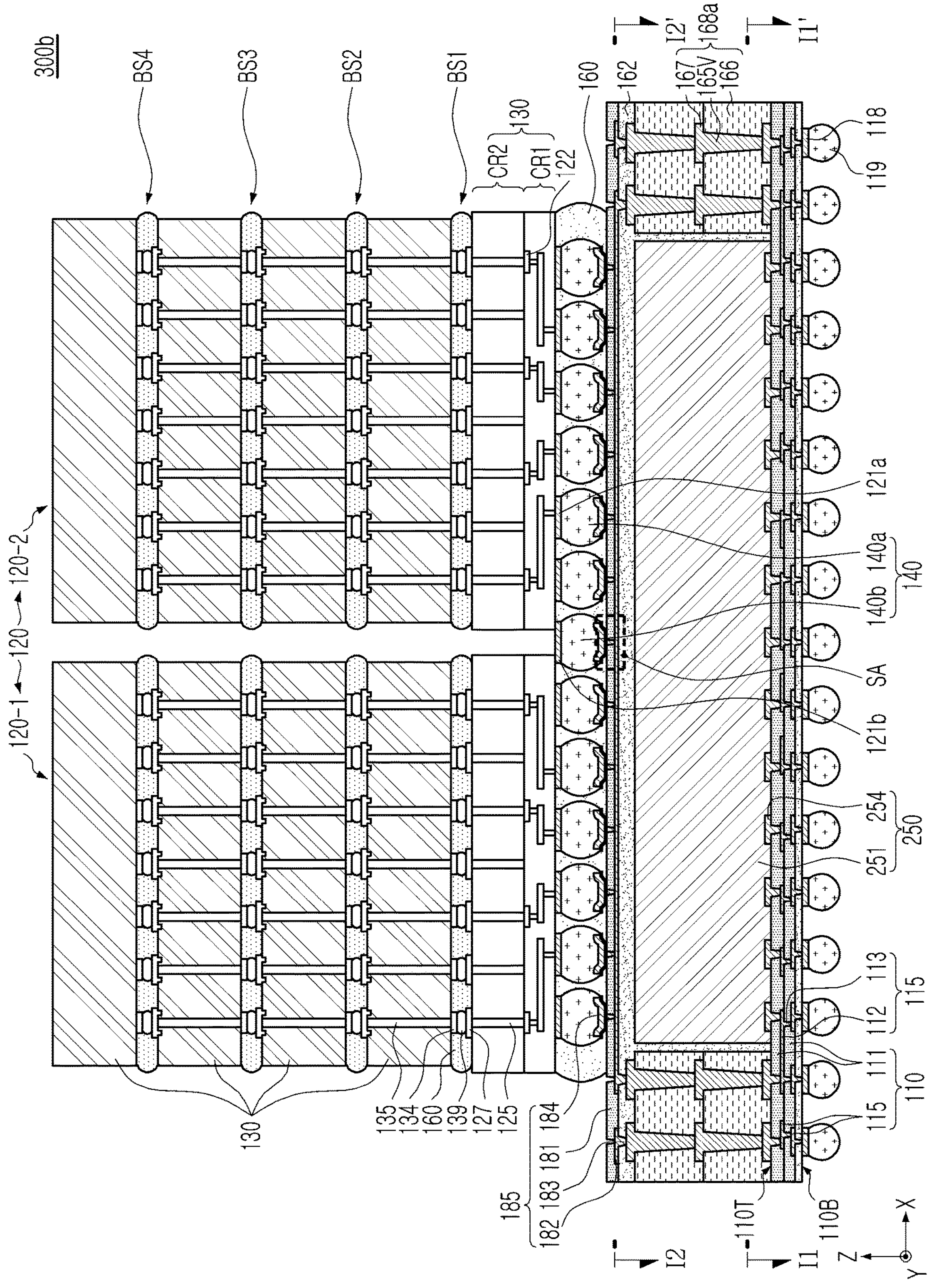
Figure 1C:
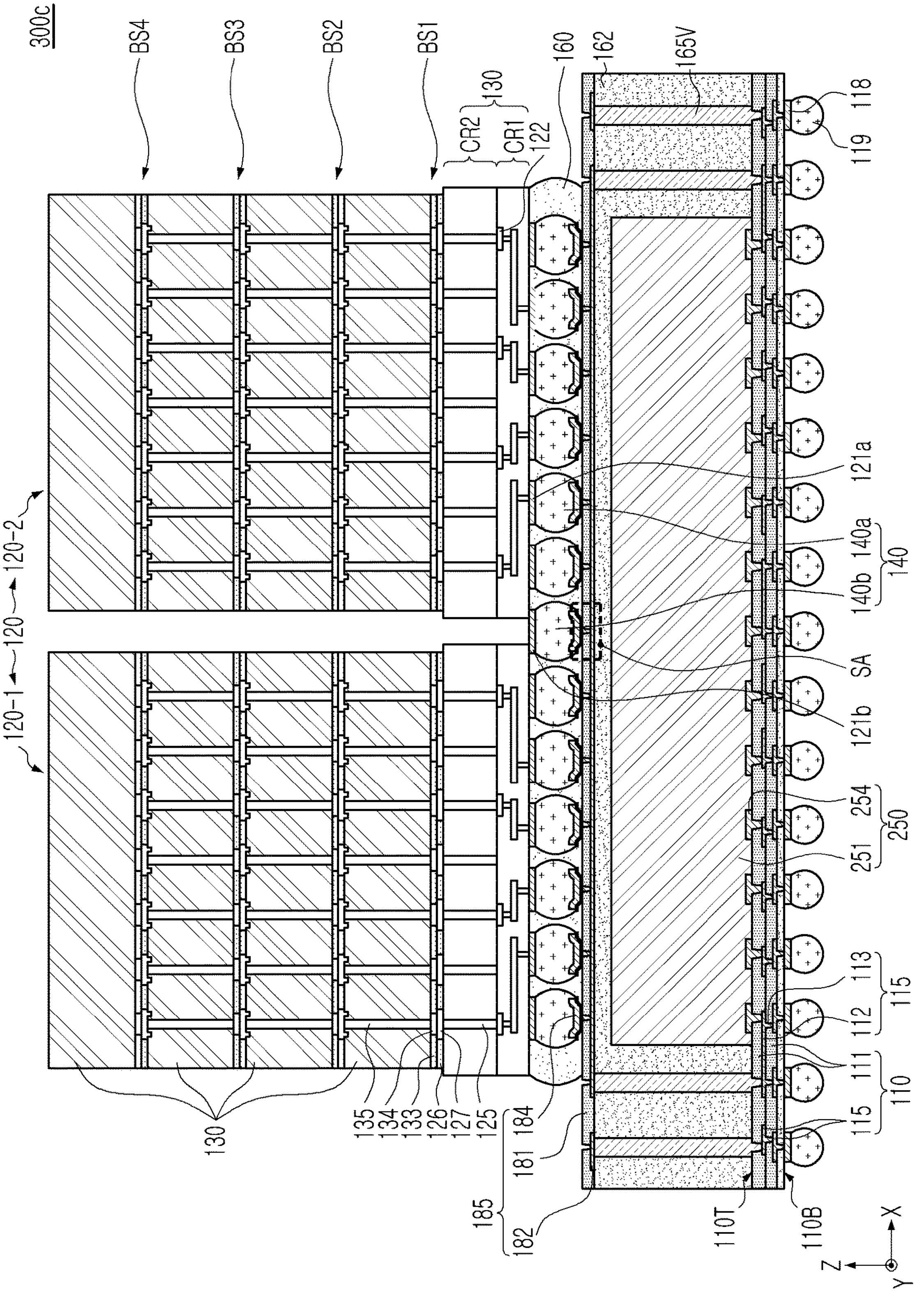
Figure 2A:
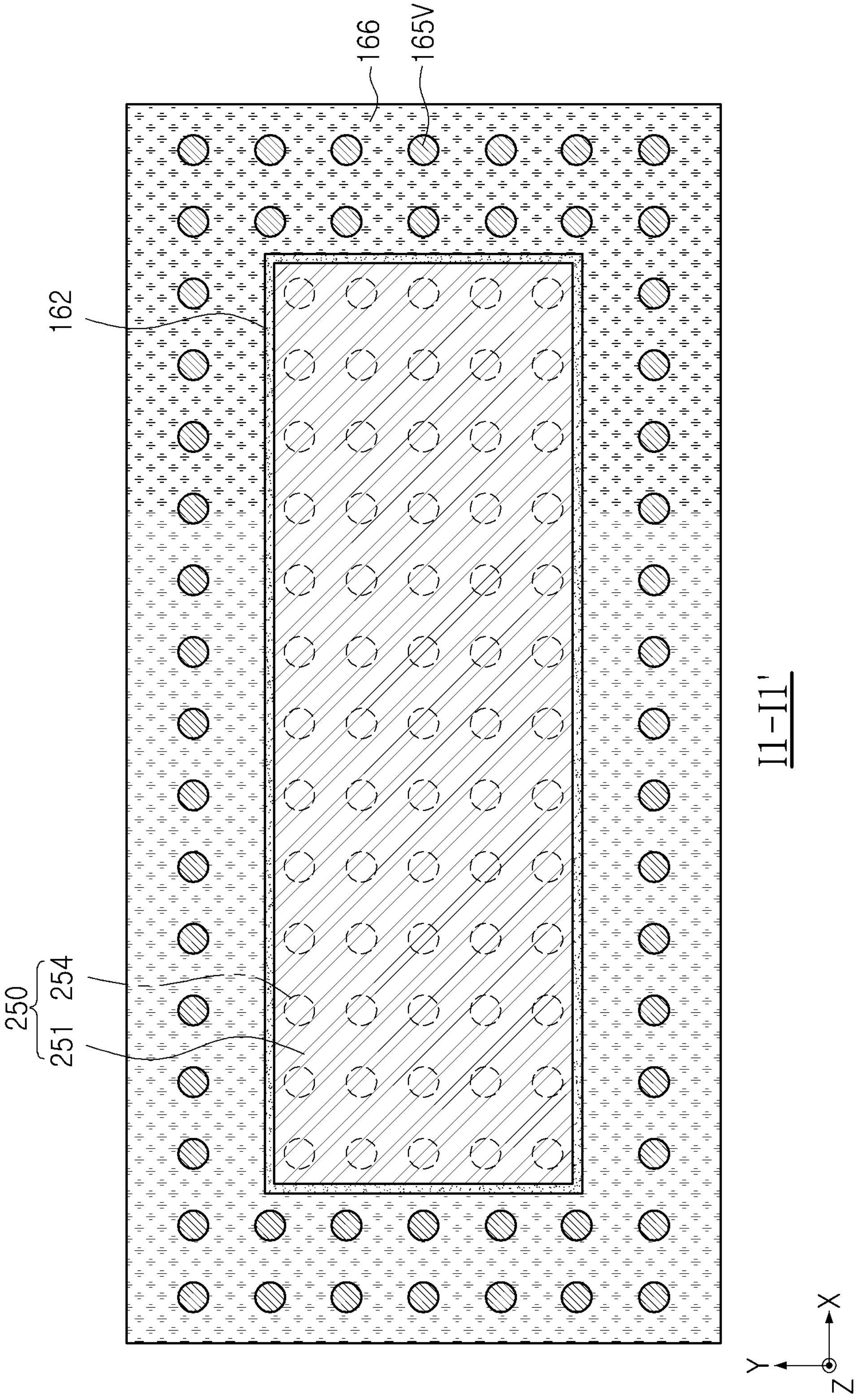
FIG. 2A is a cross-sectional view illustrating a lower structure of a first redistribution structure of a semiconductor package according to an example embodiment of the present inventive concept.
Figure 2B:
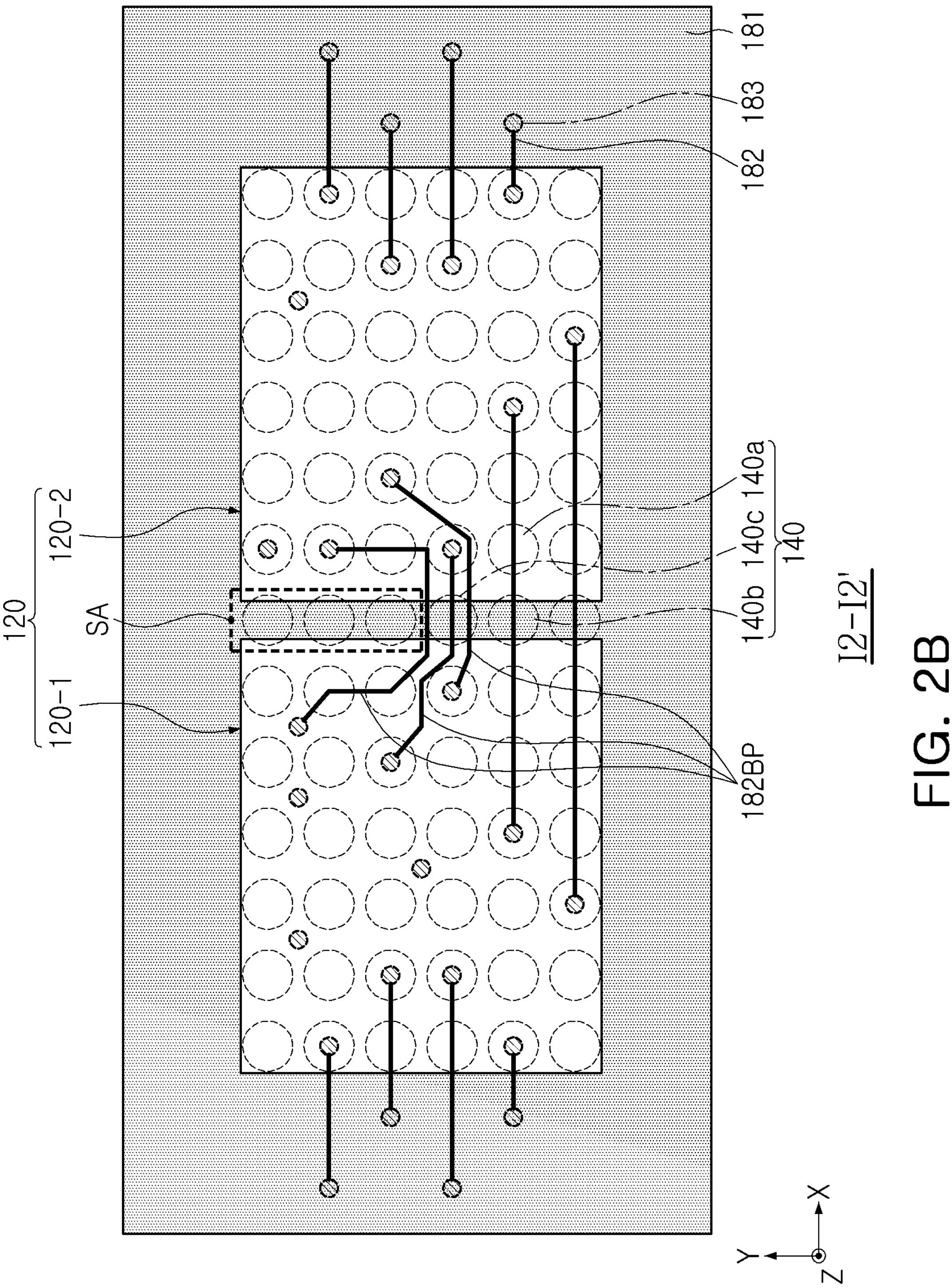
FIGS. 2B, 2C and 2D are cross-sectional views illustrating a first redistribution structure of a semiconductor package according to an example embodiment of the present inventive concept.

FIGS. 1A to 1C are cross-sectional views illustrating semiconductor packages 300*a*, 300*b*, and 300*c* according to an example embodiment of the present inventive concept, when cut along an X-Z plane A cross-section obtained by cutting the semiconductor packages 300*a* and 300*b* of FIG. 1A or 1B in an X-Y plane from I1 to I1' is a cross-section (I1-I1') of FIG. 2A, and a cross-section obtained by cutting the semiconductor package 300*a* or 300*b* of FIG. 1A or 1B along an X-Y plane from I2 to I2' is a cross-section (I2-I2') of FIG. 2B. For example, the semiconductor package packages 300*a*, 300*b*, and 300*c* may be a System in Package (SIP) including two or more semiconductor chips, and may include at least a portion of a Package on Package (POP) structure.

Referring to FIGS. 1A, 2A, and 2B, the semiconductor package 300*a* according to an example embodiment of the present inventive concept may include a first redistribution structure 185, at least one of first semiconductor chips 120-1, and at least one of second semiconductor chips 120-2.

The first redistribution structure 185 may have a structure in which at least one first redistribution layer 182 and at least one first insulating layer 181 are alternately stacked. The first redistribution structure 185 may further include first redistribution vias 183 extending from at least one redistribution layer 182 in a stacking direction (e.g., Z-direction) of the first redistribution structure 185. The first redistribution vias 183 may penetrate at least one first insulating layer 181.

At least one first insulating layer 181 may include an insulating material, and may include, for example, a thermosetting resin such as epoxy resin or a thermoplastic resin such as polyimide. For example, at least one first insulating layer 181 may include a photosensitive insulating material such as a photosensitive insulating material such as a photo imageable dielectric (PID) resin. In addition, at least one first insulating layer 181 may include a resin mixed with an inorganic filler, for example, an Ajinomoto Build-up Film (ABF). In addition, at least one first insulating layer 181 may include prepreg, flame retardant (FR-4), or bismaleimide triazine (BT). At least one first insulating layer 181 may include the same or different materials, and depending on materials and processes forming each layer, a boundary therebetween might not be distinguished.

The first redistribution layers 182 and the first redistribution vias 183 may form first electrical paths. The first redistribution layers 182 may be disposed in a line shape on the X-Y plane, and the first redistribution vias 183 may have a cylindrical shape having an inclined side surface so that a width thereof narrows toward a lower portion or an upper portion thereof. For example, the first redistribution vias 183 are illustrated as a filled via structure in which an inside thereof is completely filled with a conductive material, but an example embodiment thereof is not limited thereto. For example, the first redistribution vias 183 may have a conformal via shape in which a metal material is formed along an inner wall of the via hole.

The first redistribution layers 182 and the first redistribution vias 183 may include a conductive material, for example, copper (Cu), aluminum (Al), silver (Ag), tin (Sn), gold (Au), nickel (Ni), lead (Pb), titanium (Ti), or alloys thereof.

The first semiconductor chips 120-1 may be disposed on an upper surface of the first redistribution structure 185, and may be electrically connected to at least one first redistribution layer 182. The second semiconductor chips 120-2 may be disposed on the upper surface of the first redistribution structure 185, and may be electrically connected to at least one first redistribution layer 182.

For example, the first semiconductor chips 120-1 may have a structure in which the semiconductor chips 130 are stacked in a Z-direction, and the second semiconductor chips 120-2 may have a structure in which the semiconductor chips 130 are stacked in the Z-direction. Each of the semiconductor chips 130 may include a body portion CR2, a device layer CR1, and connection pads 121*a*, and may be electrically connected to at least one first redistribution layer 182 through the connection pads 121*a* disposed on lower surfaces of the semiconductor chips 130.

For example, the connection pads 121*a* may include a conductive material such as tungsten (W), aluminum (Al), copper (Cu), or the like, and may be pads of a bare chip, for example, aluminum (Al) pads, but according to example embodiments of the present inventive concept, the connection pads 121*a* may be pads of a packaged chip, for example, copper (Cu) pads, according to example embodiments of the present inventive concept. For example, the body portion CR2 may include a semiconductor material such as silicon (Si), germanium (Ge), or gallium arsenide (GaAs), and the device layer CR1 may include an integrated circuit (IC).

The semiconductor chips 130 may include logic semiconductor chips and/or memory semiconductor chips. The logic semiconductor chip may be a microprocessor, for example, a central processing unit (CPU), a graphic processing unit (GPU), a field programmable gate array (FPGA), an application processor (AP), a digital signal processor, a cryptographic processor, a controller, or an application specific integrated circuit (ASIC). The memory semiconductor chip may be a volatile memory such as dynamic random access memory (DRAM), static random access memory (SRAM), or the like, or a non-volatile memory such as flash memory, or the like.

For example, semiconductor chips other than lowermost semiconductor chips among the semiconductor chips 130 may be memory semiconductor chips, and the lowermost semiconductor chips may be control semiconductor chips controlling the remaining semiconductor chips (e.g., data process order determination, control to prevent errors and bad sectors, buffering to control loading, frequency boosting interface (FBI)).

The total performance (e.g., data storage capacity, data processing speed, and the like) of the first semiconductor chips 120-1 and the second semiconductor chips 120-2 may be proportional to a total volume, and the total volume may be proportional to a total load of the first semiconductor chips 120-1 and the second semiconductor chips 120-2. As the total load increases, a force applied to a region overlapping the first semiconductor chips 120-1 and the second semiconductor chips 120-2 in the Z-direction in the first redistribution structure 185 may increase, and the difficulty in securing reliability (e.g., crack prevention performance, stacking stability) of the first redistribution layers 182 may also increase. Due to the reliability of the first redistribution structure 185 (e.g., warpage prevention performance, delamination prevention performance) or a size of the first redistribution structure 185 in a horizontal direction may also be limited. Accordingly, a total height of the first semiconductor chips 120-1 and the second semiconductor chips 120-2 may increase, and as the total height increases, the force applied to the region overlapping the first semiconductor chips 120-1 and the second semiconductor chips 120-2 in the Z-direction in the first redistribution structure 185 may be increased.

Referring to FIGS. 1A, 2A, and 2B, a semiconductor package 300*a* according to an example embodiment of the present inventive concept may include bumps 140 or further include a lower structure of a first redistribution structure 185. The lower structure of the first redistribution structure 185 may include a second redistribution structure 110, an embedded semiconductor chip 250, conductive vias 165V, and an encapsulant 162.

The bumps 140 may electrically connect the first redistribution structure 185 and one of the first semiconductor chips 120-1 to each other or the first redistribution structure 185 and one of the second semiconductor chips 120-2 to each other. For example, the bumps 140 may be disposed between the first redistribution structure 185 and one of the first semiconductor chips 120-1 and between the first redistribution structure 185 and one of the second semiconductor chips 120-2.

For example, the bumps 140 may have a ball or column shape, and may include solder including tin (Sn) or an alloy (Sn—Ag—Cu) including tin (Sn). Since the bumps 140 may have a relatively low melting point compared to other metal materials, the bumps 140 may be connected to and fixed to UBMs 184 disposed on the upper surface of the first redistribution structure 185 by, for example, a thermal compression bonding (TCB) process or a reflow process. For example, the UBMs 184 may have a wider width than a line width of the redistribution layer, such as a pad, may have an upper surface/a lower surface, close to a circular shape, and may be coupled to one of the first redistribution vias 183 and formed by a semi-additive process (SAP).

For example, the bumps 140 may be surrounded by a non-conductive film layer 160. For example, the non-conductive film layer 160 may be referred to as an underfill layer, may include a non-conductive polymer, may include a non-conductive paste (NCP), and may increase reliability (e.g., crack prevention performance, electrical connection stability) of the bumps 140. In addition, at least a portion of the non-conductive film layer 160 may be replaced with at least a portion of an upper encapsulant 262. The upper encapsulant 262 may encapsulate the first and second semiconductor chips 120-1 and 120-2, and may combine the first and second semiconductor chips 120-1 and 120-2 in an integrated structure 120.

Since the bumps 140 may include a conductive material, they may have stronger rigidity than the non-conductive film layer 160. Accordingly, loads of the first semiconductor chips 120-1 and the second semiconductor chips 120-2 may be concentrated on the bumps 140.

Depending on the positions of the bumps 140, loads received by the bumps 140 may be different from each other. Accordingly, among the bumps 140, bumps receiving a relatively large load may apply strong stress to a specific point of the first redistribution layers 182 of the first redistribution structure 185. The stress concentration region SA may overlap the specific point in the Z-direction.

For example, one portion 140*b* of the bumps 140 may overlap a space between the first and second semiconductor chips 120-1 and 120-2 in the Z-direction, and may be bumps receiving a relatively large load, compared to the other portion 140*a*.

The second redistribution structure 110 may have a structure in which at least one second redistribution layer 112 and at least one second insulating layer 111 are alternately stacked, and may include second redistribution vias 113. At least one second redistribution layer 112 and the second redistribution vias 113 may form second electrical paths 115. Each of the second redistribution structure 110, the second redistribution layers 112, the second insulating layers 111, and the second redistribution vias 113 may be implemented in a manner similar to the first redistribution structure 185, the first redistribution layers 182, the first insulating layers 181, and the first redistribution vias 183. A lower surface 110B of the second redistribution structure 110 may include lower UBMs 119 providing a disposition and connection region for the lower bumps 118. The lower bumps 118 may be implemented in a manner similar to the bumps 140.

The embedded semiconductor chip 250 may be disposed between the first and second redistribution structures 185 and 110, and may be implemented in a manner similar to that of the semiconductor chips 130. For example, the embedded semiconductor chip 250 may include a body portion 251 and connection pads 254, and may further include a device layer between the body portion 251 and the connection pads 254. For example, the embedded semiconductor chip 250 may be disposed on and connected to an upper surface 110T of the second redistribution structure 110 through the connection pads 254. For example, when the first and second semiconductor chips 120-1 and 120-2 are memory semiconductor chips, the embedded semiconductor chip 250 may be a logic semiconductor chip or an application processor (AP).

The conductive vias 165V may electrically connect the first and second redistribution structures 185 and 110 to each other. For example, the conductive vias 165V may be disposed on a core insulating layer 166, and penetrate the core insulating layer 166. For example, the core insulating layer 166 may be included in a core member 168*b* of a panel level package (PLP), and the conductive vias 165V may be implemented in a manner similar to vias of a printed circuit board.

The core insulating layer 166, which may be included in the semiconductor package 300*a*, may be disposed between the first and second redistribution structures 185 and 110, may at least partially surround the embedded semiconductor chip 250, and may surround at least a portion of the encapsulant 162. For example, the core insulating layer 166 may be thicker than each of the first insulating layers 181 and may have stronger rigidity than each of the first insulating layers 181. Accordingly, the core insulating layer 166 may reduce a possibility of warpage of the semiconductor packages 300*a* and 300*b*. For example, the core insulating layer 166 may include an insulating material similar to that of a core disposed in a center of the printed circuit board, and may be formed by removing a portion (corresponding to first and second cavities CS1 and CS2) of a copper clad laminate (CCL). The number of stacked layers of the core insulating layer 166 is not particularly limited.

The core insulating layer 166 may be included in core members 168*a* and 168*b*, and the core members 168*a* and 168*b* may include conductive vias 165V and a core interconnection layer 167. The core interconnection layer 167 may be disposed on an upper and/or a lower surface of the core insulating layer 166, may be connected to the conductive vias 165V, and may be electrically connected to the first and second redistribution structures 185 and 110. The conductive vias 165V of FIG. 1A may have a structure formed in both directions in a +Z-direction and a −Z-direction, and the conductive vias 165V of FIG. 1B may have a structure formed in one direction in a +Z-direction.

In addition, the conductive vias 165V of FIG. 1C may penetrate the encapsulant 162 without a core insulating layer, and may be copper posts of a wafer level package (WLP). For example, the conductive vias 165V may be formed prior to the encapsulant 162, and may be formed by a process of plating a metal material (e.g., copper) in through-holes of a photo resist, temporarily formed prior to the encapsulant 162, or may be formed by a process of filling a conductive paste therein.

The embedded semiconductor chip 250 may be electrically connected to the first and second semiconductor chips 120-1 and 120-2 through the second redistribution structure 110, the conductive vias 165V, and the first redistribution structure 185.

The encapsulant 162 may be disposed between the first and second redistribution structures 185 and 110, and encapsulate the embedded semiconductor chip 250. Since the encapsulant 162 can fill an empty space formed between the first and second redistribution structures 185 and 110, robustness of the embedded semiconductor chip 250 against an outside thereof may be increased, and durability (e.g., robustness against external impact) or reliability (internal warpage prevention performance) of the semiconductor package 300*a* may be increased.

For example, the encapsulant 162 may include a molding material such as an epoxy molding compound (EMC). However, the material that can be included in the encapsulant 162 is not limited to the molding material, and may include an insulating material that can have protective properties similar to those of the molding material or high ductility. For example, the insulating material may be a build-up film (e.g., an Ajinomoto Build-up Film (ABF)), may be a thermosetting resin such as an epoxy resin, or a thermoplastic resin such as polyimide, and may be an insulating material in which inorganic fillers and/or glass fibers are appropriately added. An upper encapsulant 262 may be implemented in a manner similar to that of the encapsulant 162.

Since the conductive vias 165V may include a conductive material, the conductive vias 165V may have stronger rigidity than the encapsulant 162. Since the core insulating layer 166 may also be implemented in a manner similar to that of the core of the printed circuit board, the core insulating layer 166 may have stronger rigidity than the encapsulant 162. Accordingly, a reaction to the load of the first semiconductor chips 120-1 and the second semiconductor chips 120-2 may be concentrated on the conductive vias 165V or the core insulating layer 166. Depending on the positions of the conductive vias 165V or the core insulating layer 166, a reaction force for each position of the conductive vias 165V or the core insulating layer 166 may be different. Therefore, among each of the positions of the conductive vias 165V or the core insulating layer 166, a position of the conductive via or the core insulating layer 166 having a relatively strong reaction force may apply strong stress to a specific point of the first redistribution layers 182 of the first redistribution structure 185. The stress concentration region SA may overlap the specific point in the Z-direction.

Referring to FIGS. 2B to 4C, at least one first redistribution layer 182 may include a detour redistribution line 182BP disposed so that at least a portion thereof overlaps a space between the first and second semiconductor chips 120-1 and 120-2 in a Z-direction.

The detour redistribution line 182BP may circuitously extend across the space between the first and second semiconductor chips 120-1 and 120-2 so as not to overlap the stress concentration region SA partially overlapping a portion of one flank (e.g., +Y-direction) of a space between the first and second semiconductor chips 120-1 and 120-2, or may circuitously extend to the stress concentration region SA. The overlapping direction may be a Z-direction.

Accordingly, the detour redistribution line 182BP may be endurant to a lower structure of the first redistribution structure 185 or bumps 140 concentrating force on the stress concentration region SA of the first redistribution structure 185, so that reliability (e.g., crack prevention performance, stacking stability) of the detour redistribution line 182BP can be effectively increased. Accordingly, overall reliability (e.g., crack prevention performance, stacking stability) of the first redistribution structure 185 may be efficiently increased.

The detouring of the detour redistribution line 182BP means that the length of the detour redistribution line 182BP is longer than the length of a straight line connecting one end and the other end of the detour redistribution line 182BP to each other. For example, when the detour redistribution line 182BP circuitously extends so as not to overlap the stress concentration region SA, a straight line for connecting between one end and the other end of the detour redistribution line region 182BP may cross the stress concentration region SA, and the detour redistribution line 182BP may have a shape partially surrounding the stress concentration region SA. For example, the detour redistribution line 182BP may have a plurality of bends such that it does not overlap the stress concentration region SA.

One portion of at least one of additional redistribution lines, which is included in at least one first redistribution layer 182 and is different from the detour redistribution line 182BP that is included in at least one first redistribution layer 182, may also overlap a space between the first and second semiconductor chips 120-1 and 120-2 in the Z-direction. Since at least one of the additional redistribution lines hardly detours or may be straight, at least one of the additional redistribution lines and the detour redistribution line 182BP may be more adjacent to each other in the portion of the first redistribution layer 185 overlapping the space between the first and second semiconductor chips 120-1 and 120-2 in the Z-direction than in other portions of the first redistribution layer 185.

In addition, the detour redistribution lines 182BP may be concentrated and disposed in a portion overlapping a bump 140*c* in the Z-direction, and the portion does not overlap the stress concentration region SA in the Z-direction. The bump 140*c* may be disposed in a portion that overlaps the space between the first and second semiconductor chips 120-1 and 120-2 in the Z-direction. From a viewpoint of one of the detour redistribution lines 182BP, the other one of the detour redistribution lines 182BP may be one of the additional redistribution lines. Accordingly, the shape of the additional redistribution lines is not limited to a straight line, and may be a relatively slightly detoured shape. For example, the additional redistribution lines may include at least one bend.

For example, the stress concentration region SA may overlap the space between the first and second semiconductor chips 120-1 and 120-2 among the bumps 140 in the Z-direction, or may overlap an outermost bump that is on one flank (e.g., +Y-direction) of the adjacent bumps 140*b* in the Z-direction. The outermost bump that is on one flank of the adjacent bumps 140*b* may be disposed in a portion that overlaps the space between the first and second semiconductor chips 120-1 and 120-2 in the Z-direction. Since the outermost bump may be closest to one corner of the first and second semiconductor chips 120-1 and 120-2 when compared to the other bumps 140, the outermost bump may be a point on which loads of the first and second semiconductor chips 120-1 and 120-2 are most concentrated.

The number of bumps 140 (aligned in a Y-direction) overlapping the stress concentration region SA in the Z-direction may be 1 or more and 3 or less, but the present inventive concept is not limited thereto. For example, the stress concentration region SA may be long in the Y-direction so as to overlap in the Z-direction with a center of the space between the first and second semiconductor chips 120-1 and 120-2.

The stress concentration region SA partially overlaps a portion of the space between the first and second semiconductor chips 120-1 and 120-2, which means the remaining of the space between the first and second semiconductor chips 120-1 and 120-2 does not overlap the stress concentration region SA in the Z-direction. The stress concentration is located to be biased to one flank (e.g., +Y-direction), which may be because a center of gravity of the first and second semiconductor chips 120-1 and 120-2 is biased toward one flank (e.g., +Y-direction) than a center of the first and second semiconductor chips 120-1 and 120-2, but the present inventive concept is not limited thereto.

Here

Figure 2C:
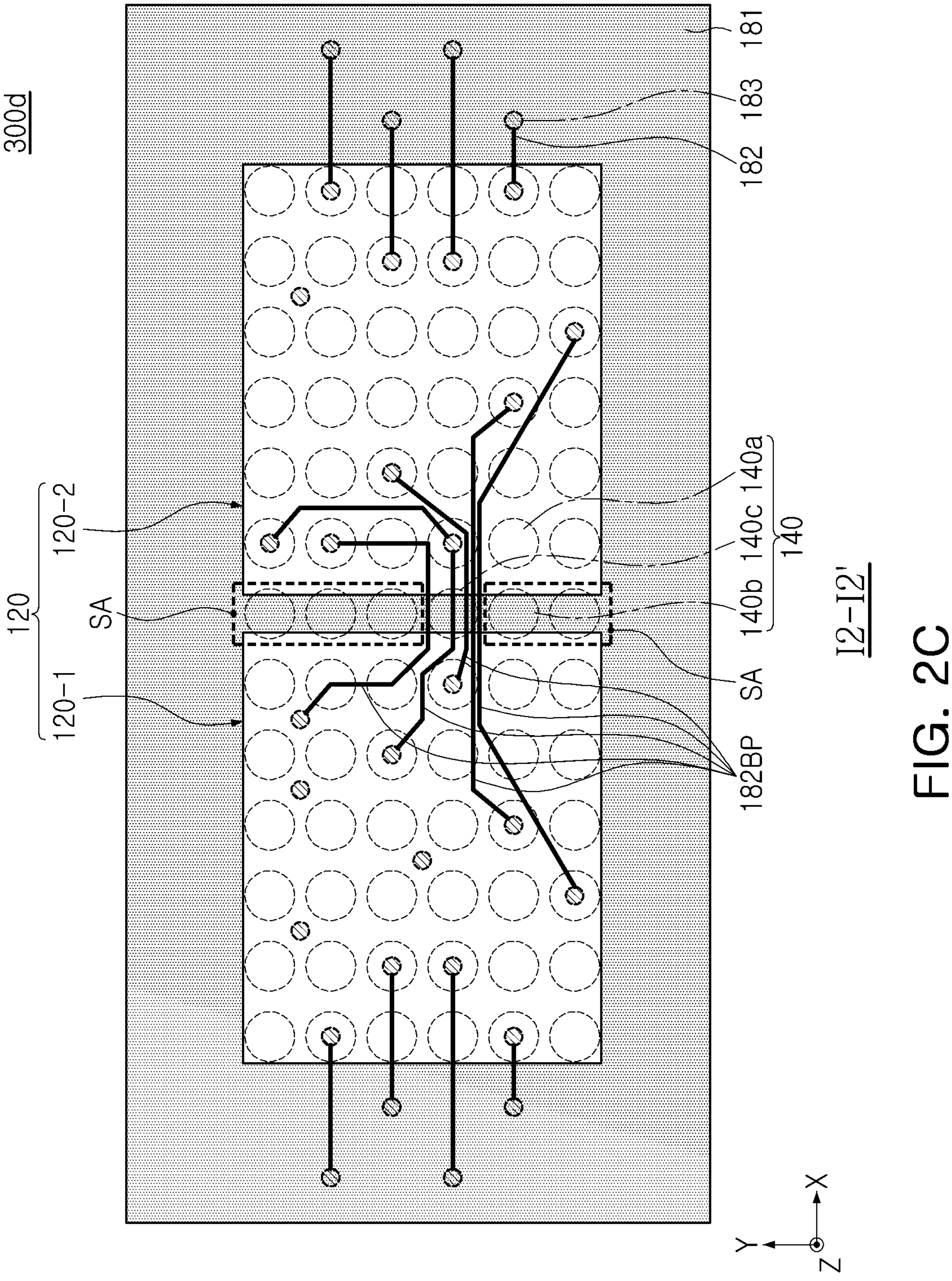

Referring to FIG. 2C, a stress concentration region SA of a semiconductor package 300*d* according to an example embodiment of the present inventive concept may both overlap a portion of one flank of the space between the first and second semiconductor chips 120-1 and 120-2 (e.g., +Y-direction) and a portion of another flank thereof (e.g., −Y-direction) in the Z-direction. Here, a portion of the detour redistribution lines 182BP may partially surround one portion of the stress concentration region SA, and the remaining of the detour redistribution lines 182BP may partially surround the other portion of the stress concentration region SA. A portion of each of the detour redistribution lines 182BP may be concentrated in a portion overlapping a bump 140*c*, which is disposed in the portion overlapping the space between the first and second semiconductor chips 120-1 and 120-2 in the Z-direction, in the Z-direction.

Figure 2D:
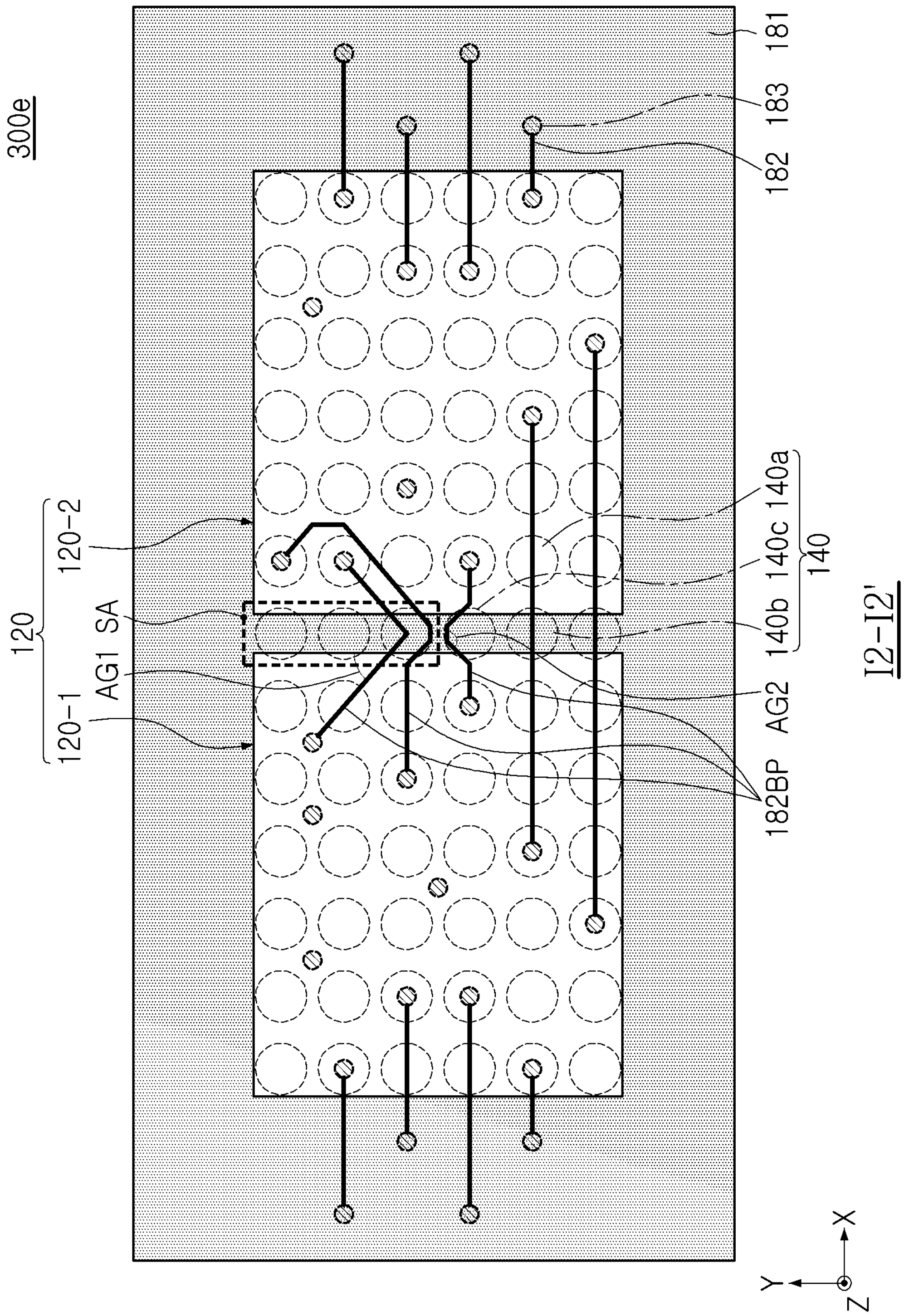

Referring to FIG. 2D, the detour redistribution lines 182BP of a semiconductor package 300*e* according to an example embodiment of the present inventive concept may extend to detour the stress concentration region SA.

For example, the detour redistribution line 182BP may have a shape in which an extending direction is bent at a portion overlapping the space between the first and second semiconductor chips 120-1 and 120-2 in the Z-direction. Accordingly, reliability of a portion of the detour redistribution line 182BP overlapping the stress concentration region SA or a portion thereof adjacent to the stress concentration region SA may be increased. An angle AG2 at which the detour redistribution line 182BP is bent is not particularly limited.

For example, a portion of the detour redistribution line 182BP overlapping a boundary line of one of the first or second semiconductor chips 120-1 or 120-2 may be oblique with respect to the boundary line. Accordingly, reliability of a portion overlapping or adjacent to the stress concentration region SA of the detour redistribution line 182BP may be increased. An angle AG1 at which the detour redistribution line 182BP crosses the boundary line may be an acute angle or an obtuse angle, but the present inventive concept is not limited thereto. For example, the intersection between the detour redistribution line 182BP and the boundary line may form the angle AG1, which may be an acute angle or an obtuse angle.

Figure 3A:
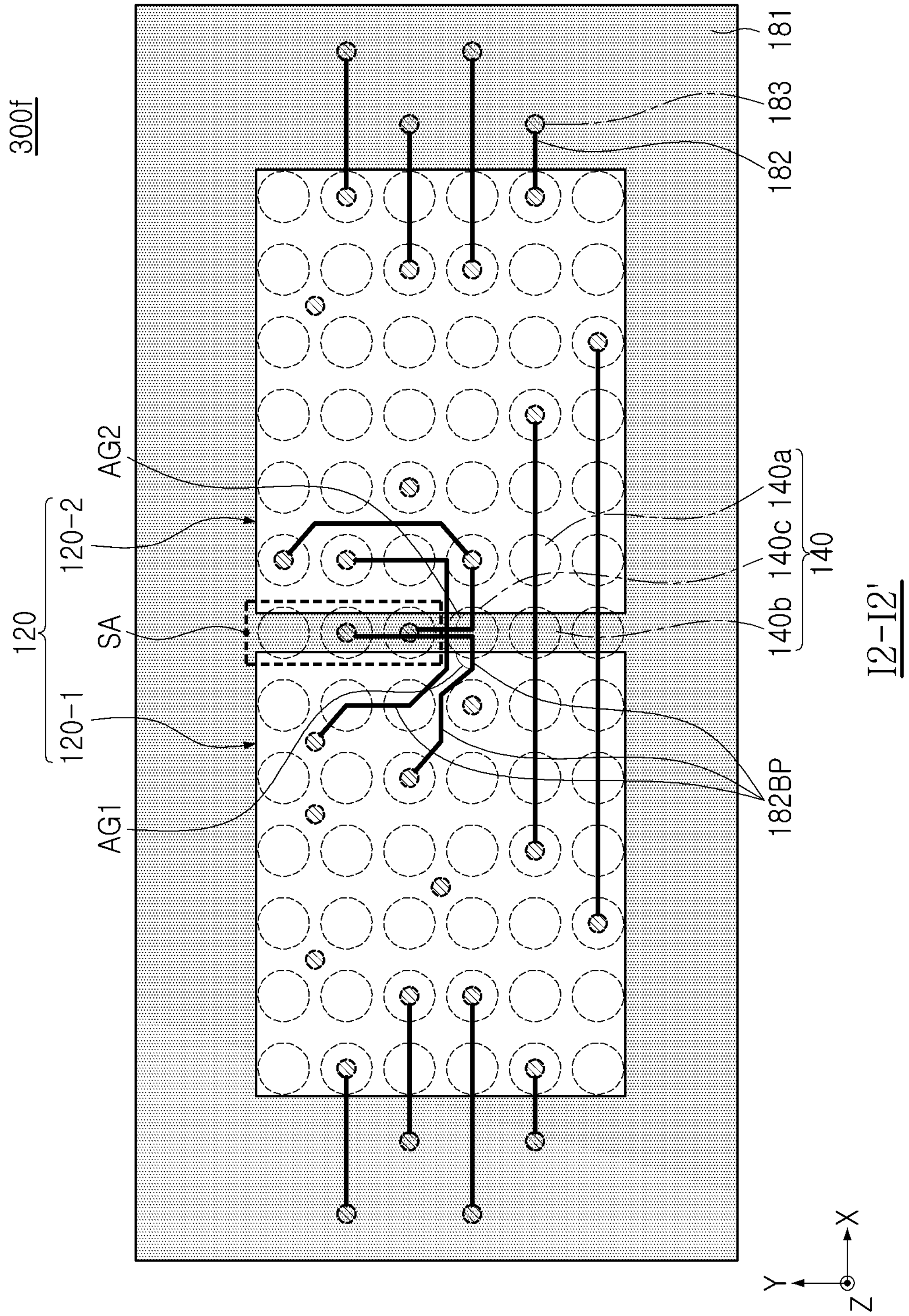
FIGS. 3A and 3B are cross-sectional views illustrating a structure in which one of first redistribution vias of the first redistribution structure of the semiconductor package overlaps a stress concentration region according to an example embodiment of the present inventive concept.
Figure 3B:
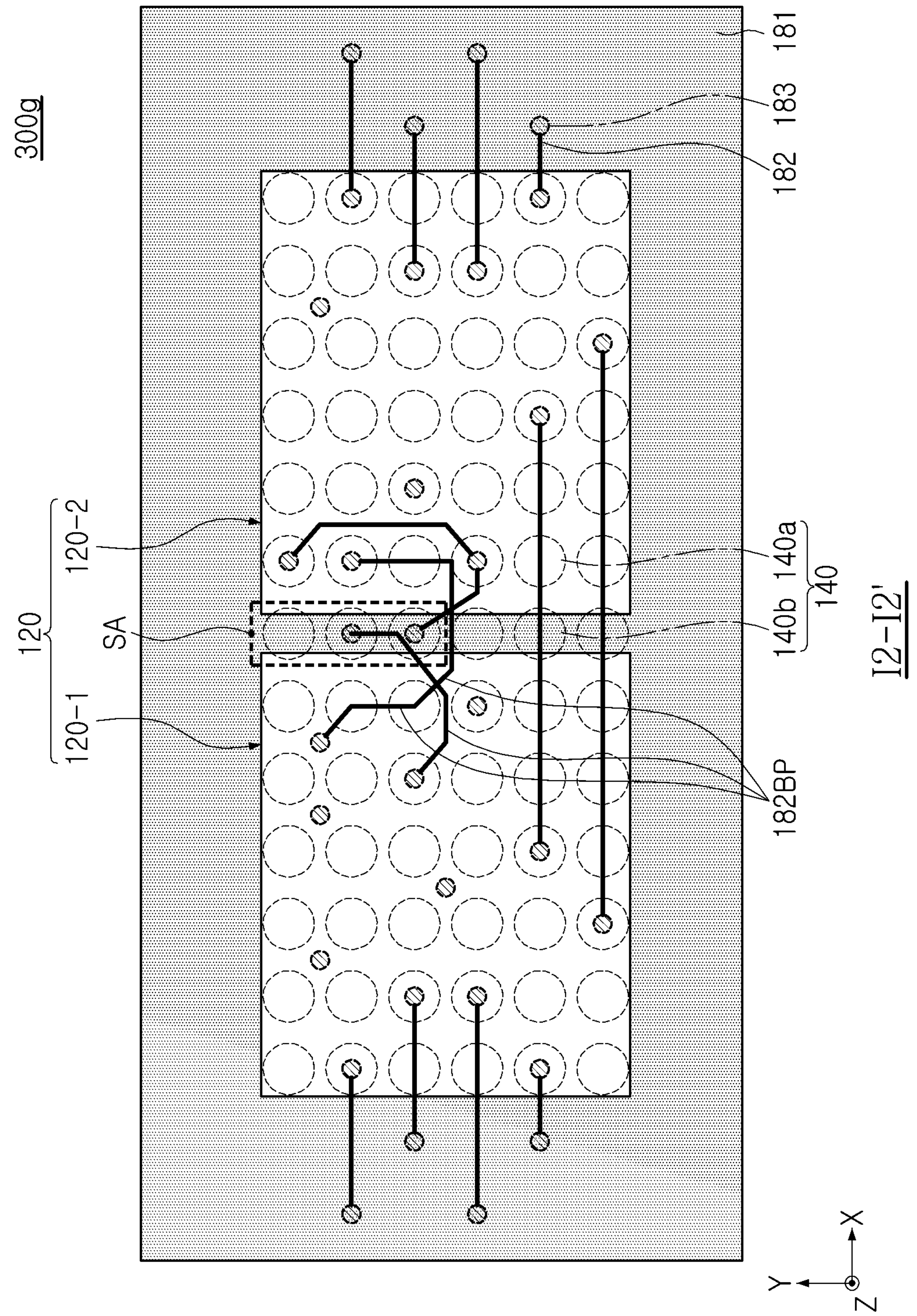

Referring to FIGS. 3A and 3B, one of the first redistribution vias 183 connected to the detour redistribution line 182BP may overlap a stress concentration region SA in a Z-direction, and the detour redistribution line 182BP may extend to detour the stress concentration region SA.

Referring to FIG. 3A, in the detour redistribution lines 182BP of a semiconductor package 300*f* according to an example embodiment of the present inventive concept, an angle AG2 at which the detour redistribution lines 182BP are bent may be a right angle, and an angle AG1 crossing a boundary line of one of the first or second semiconductor chips 120-1 and 120-2 may also be a right angle. Accordingly, an angle formed by a direction in which the detour redistribution lines 182BP extend into the stress concentration region SA and the boundary line of the first and second semiconductor chips 120-1 and 120-2 may be 0 degrees (parallel). For example, portions of the detour redistribution lines 182BP may extend parallel to the boundary lines of the first and second semiconductor chips 120-1 and 120-2, which face each other, such that the portions of the detour redistribution lines 182BP extend into the stress concentration region SA. Accordingly, even if a portion of the detour redistribution lines 182BP overlaps the stress concentration region SA, reliability of the detour redistribution lines 182BP may be secured.

Referring to FIG. 3B, an angle at which the detour redistribution lines 182BP of a semiconductor package 300*g* are bent according to an example embodiment of the present inventive concept might not be a right angle, and an angle at which the detour redistribution lines 182BP cross the boundary line of the first and second semiconductor chips 120-1 and 120-2 might also not be a right angle. Accordingly, an angle formed between a direction in which the detour redistribution lines 182BP extend into the stress concentration region SA and the boundary line of the first and second semiconductor chips 120-1 and 120-2 may be an acute angle or an obtuse angle (oblique angle). Accordingly, even if a portion of the detour redistribution lines 182BP overlaps the stress concentration region SA, reliability of the detour redistribution lines 182BP may be secured.

When an angle AG1 is a right angle, the detour redistribution lines 182BP may be bent at a portion overlapping the space between the first and second semiconductor chips 120-1 and 120-2. Accordingly, an angle formed by a direction in which the detour redistribution lines 182BP extend into the stress concentration region SA and the boundary line of the first and second semiconductor chips 120-1 and 120-2 may be parallel or oblique. For example, the detour redistribution lines 182BP may extend parallel to and/or obliquely with respect to the boundary lines of the first and second semiconductor chips 120-1 and 120-2.

Figure 4A:
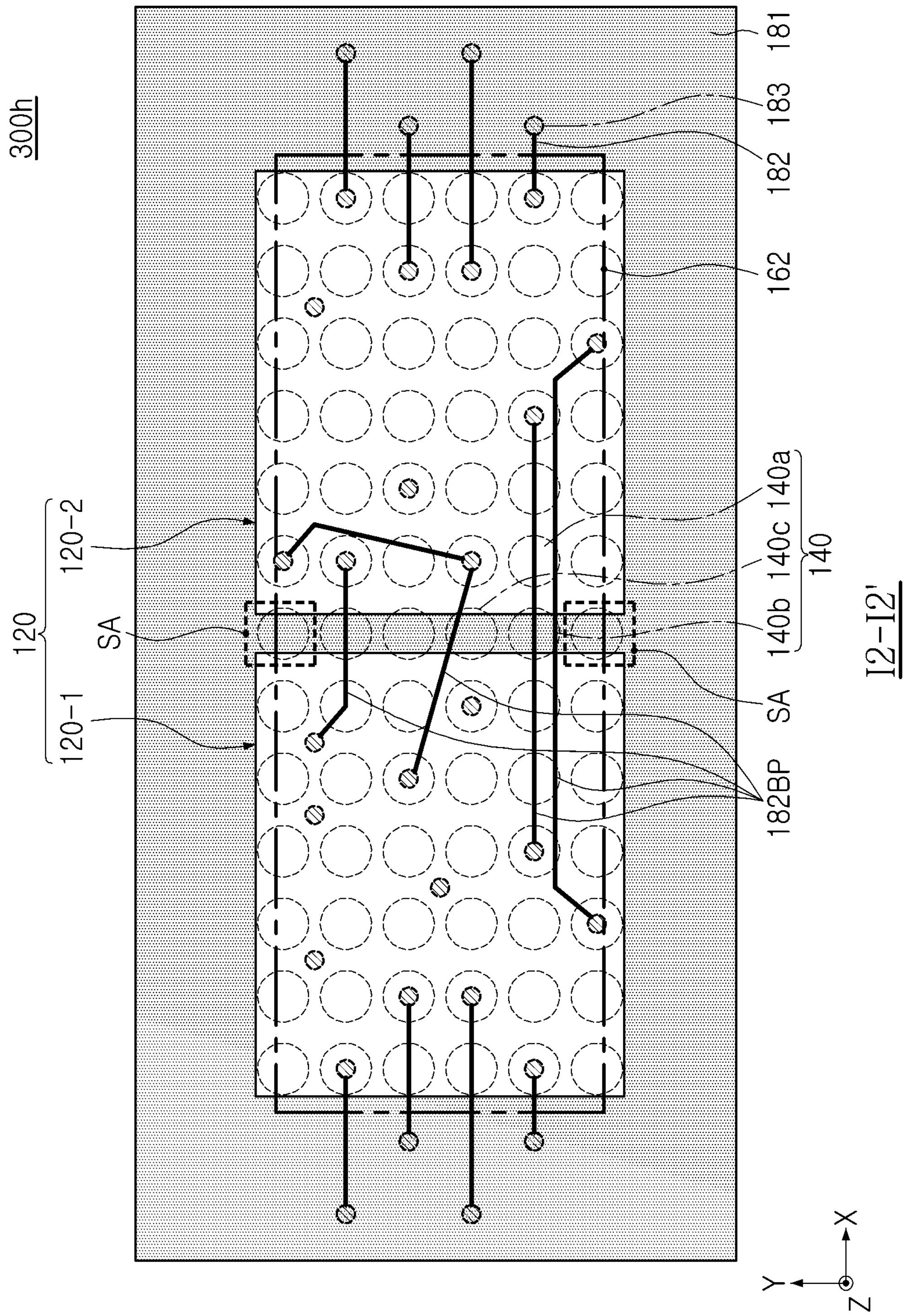
FIGS. 4A and 4B are cross-sectional views illustrating a stress concentration region in a first redistribution structure taken along a boundary line of an encapsulant of a semiconductor package according to an example embodiment of the present inventive concept.
Figure 4B:
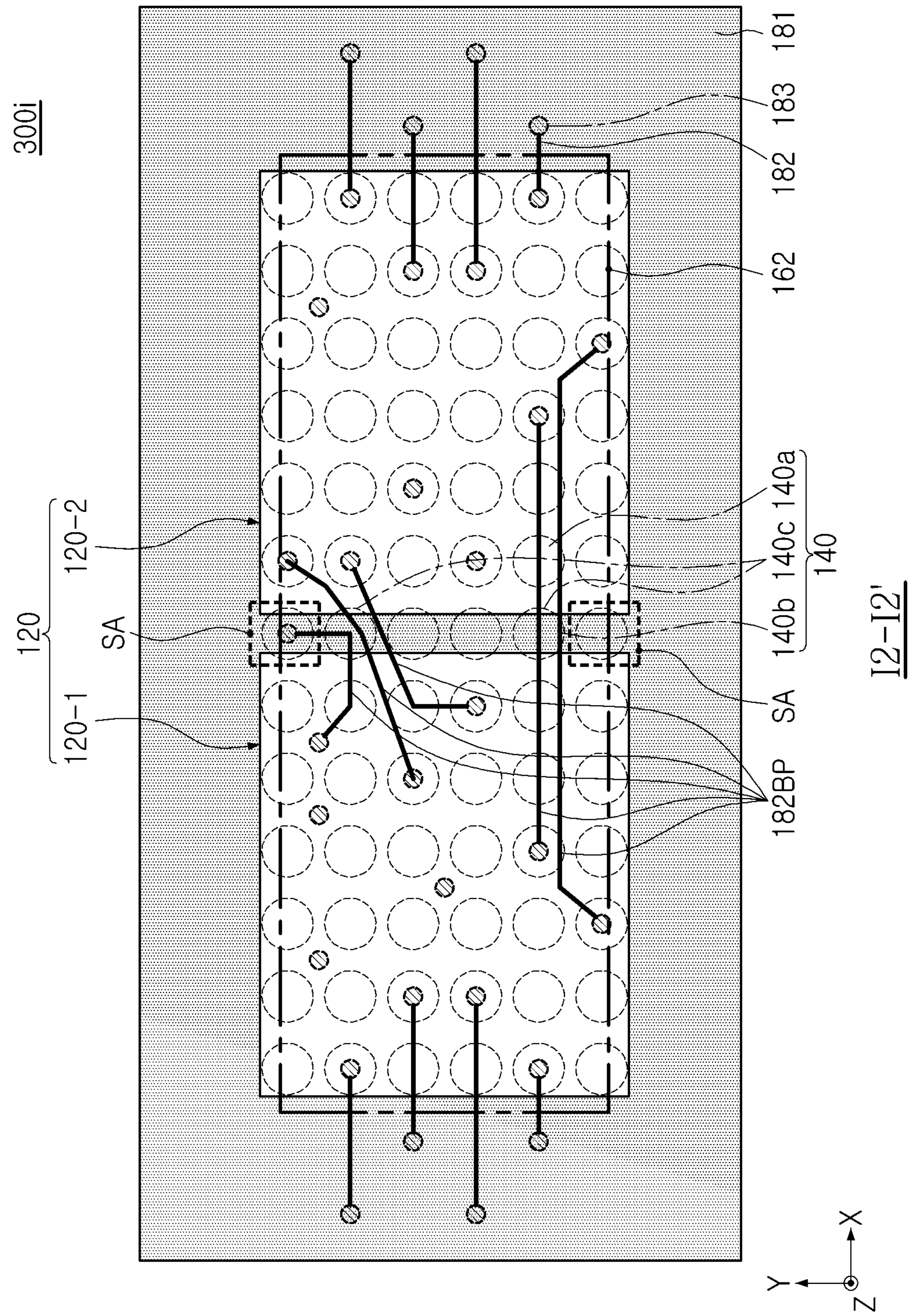

Referring to FIGS. 4A and 4B, the stress concentration region SA of the semiconductor packages 300*h* and 300*i* according to an example embodiment of the present inventive concept may be determined by a boundary line of the encapsulant 162. For example, the boundary line of the encapsulant 162 may be a boundary line of the core insulating layer (166 in FIG. 1A), or may be a position in which conductive vias (165V in FIG. 1C) are arranged.

Since rigidity between the encapsulant 162 and the conductive vias (and/or the core insulating layer) may be different from each other, the detour redistribution lines 182BP disposed relatively closer to the conductive vias (and/or the core insulating layer) may have higher reliability. This is because the conductive vias (and/or the core insulating layer) and a peripheral portion thereof can apply a force in the +Z-direction due to a reaction, when the conductive vias (and/or the core insulating layer) overlap the first and second semiconductor chips 120-1 and 120-2 in the Z-direction.

In addition, most of the region surrounded by the boundary line of the encapsulant 162 may also overlap an embedded semiconductor chip (250 in FIG. 1A), and the redistribution overlapping the embedded semiconductor chip (250 in FIG. 1A) may have high reliability due to a buffering action of the encapsulant 162.

Therefore, at least a portion of the stress concentration region SA might not overlap the embedded semiconductor chip surrounded by the boundary line of the encapsulant 162, and the detour redistribution lines 182BP may also overlap the embedded semiconductor chip due to the detouring.

The detour redistribution lines 182BP of FIG. 4A may partially surround a stress concentration region SA so as not to overlap the stress concentration region SA in the Z-direction, and one of the detour redistribution lines 182BP of FIG. 4B may extend to detour the stress concentration region SA.

Figure 4C:
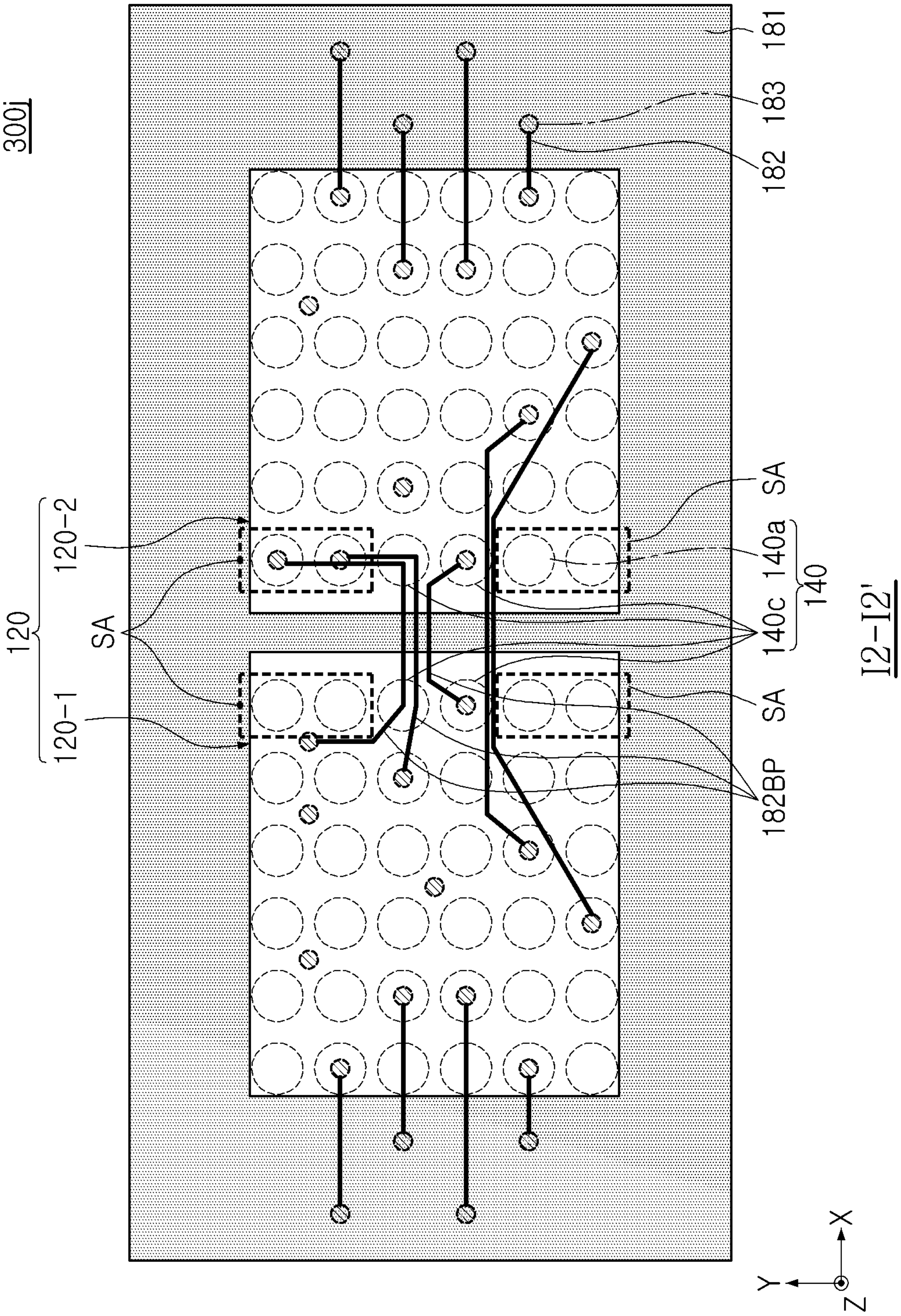
FIG. 4C is a cross-sectional view illustrating a stress concentration region in a structure in which bumps of a semiconductor package do not overlap with a space between first and second semiconductor chips, according to an example embodiment of the present inventive concept.

Referring to FIG. 4C, the bumps 140 of the semiconductor package 300*j* according to an example embodiment of the present inventive concept may overlap a space between the first and second semiconductor chips 120-1 and 120-2 in the Z-direction. Accordingly, the stress concentration region SA may be wider in the X-direction. For example, there may be a plurality of stress concentration regions SA overlapping the first and second semiconductor chips 120-1 and 120-2 in the Z-direction.

Referring to FIGS. 1A to 1C, structures BS1, BS2, BS3, and BS4 between semiconductor chips 130 may be implemented in various methods according to an example embodiment of the present inventive concept. For example, the semiconductor chips 130 of FIG. 1A might not be electrically connected to each other, but may be electrically connected to the first redistribution structure 185 in the +Y-direction by wire bonding. In addition, the semiconductor chips 130 of FIG. 1B may be electrically connected to each other through additional bumps 139, and the semiconductor chips 130 of FIG. 1C may be electrically connected to each other without additional bumps.

Referring to FIGS. 1B and 1C, the first and second semiconductor chips 120-1 and 120-2 may include a device layer 122, through-vias 125 and 135, first and second intermediate dielectric layers 126 and 133, first and second connection pads 127 and 134, additional bumps 139, and a non-conductive film layer 160.

The additional bumps 139 may electrically connect and be disposed between the semiconductor chips 130, and may be implemented in a manner similar to the bumps 140. The first connection pads 127 and the first intermediate dielectric layer 126 may be disposed on upper surfaces of the semiconductor chips 130, and the additional bumps 139 may contact and be disposed between the first connection pads 127 and the second connection pads 134. The through-vias 125 and 135 may penetrate body portions of the semiconductor chips 130, and may be electrically connected between the device layer 122 and the first connection pads 127. The through-vias 125 and 135 may be formed of a conductive material, and may include, for example, at least one of tungsten (W), aluminum (Al), and copper (Cu).

The non-conductive film layer 160 may at least partially surround additional bumps 139. For example, the non-conductive film layer 160 may be referred to as an underfill layer, and may include a non-conductive polymer. In addition, the non-conductive film layer 160 may include a non-conductive paste (NCP).

The first and second connection pads 127 and 134 may contact each other, and the first and second intermediate dielectric layers 126 and 133 may contact each other. Accordingly, the first and second connection pads 127 and 134 may be covered by the first and second intermediate dielectric layers 126 and 133, and might not be exposed to an upper encapsulant 262. This structure can be expressed as hybrid bonding. For example, each of the first and second intermediate dielectric layers 126 and 133 may include at least one of silicon oxide (SiO), silicon nitride (SiN), and/or silicon carbonitride (SiCN).

For example, before the semiconductor chips 130 are coupled, the first intermediate dielectric layer 126 and the second intermediate dielectric layer 133 may be respectively disposed on the semiconductor chips 130. Thereafter, the semiconductor chips 130 may be bonded to each other according to bonding through an interface 133B of the first intermediate dielectric layer 126 and the second intermediate dielectric layer 133.

As set forth above, according to an example embodiment of the present inventive concept, in a semiconductor package, an effect of a load of upper semiconductor chips or a support of lower conductive vias (and/or encapsulant) on reliability of the redistribution layer (and/or bumps) may be reduced.

While the present inventive concept has been described with reference to embodiments thereof, it will be understood by those of ordinary skill in the art that various changes in form and details may be made thereto without departing from the spirit and scope of the present inventive concept.

What is claimed is:

1. A semiconductor package, comprising:

a first redistribution structure having a structure in which at least one first redistribution layer and at least one first insulating layer are alternately stacked on each other;

a first semiconductor chip disposed on the first redistribution structure;

a second semiconductor chip disposed on the first redistribution structure; and bumps disposed between the first redistribution structure and the first semiconductor chip and between the first redistribution structure and the second semiconductor chip, wherein the at least one first redistribution layer includes a detour redistribution line disposed so that a portion of the detour redistribution line overlaps a space between the first and second semiconductor chips, wherein the detour redistribution line circuitously extends across the space between the first and second semiconductor chips so as not to overlap a stress concentration region partially overlapping a portion of one flank of the space between the first and second semiconductor chips, or extends into the stress concentration region, and wherein a portion of the bumps overlaps the space between the first and second semiconductor chips.

2. The semiconductor package of claim 1, wherein the stress concentration region overlaps an outermost bump of the bumps, and the outermost bump overlaps the space between the first and second semiconductor chips.

3. The semiconductor package of claim 2, wherein the stress concentration region overlaps a center of the space that is between the first and second semiconductor chips.

4. The semiconductor package of claim 1, wherein the first redistribution structure comprises first redistribution vias penetrating the at least one first insulating layer and connected to the at least one first redistribution layer, one of the first redistribution vias connected to the detour redistribution line overlaps the stress concentration region, and the detour redistribution line extends to the stress concentration region.

5. The semiconductor package of claim 1, wherein the first redistribution structure comprises first redistribution vias penetrating the at least one first insulating layer and connected to the at least one first redistribution layer, one of the first redistribution vias connected to the detour redistribution line overlaps the stress concentration region, and a direction in which the detour redistribution line extends from one of the first redistribution vias is oblique or parallel to a boundary line of at least one of the first semiconductor chip or the second semiconductor chip in the stress concentration region.

6. The semiconductor package of claim 1, wherein the detour redistribution line has a shape in which an extending direction is bent at a portion overlapping between the first and second semiconductor chips.

7. The semiconductor package of claim 1, wherein a portion of the detour redistribution line, overlapping a boundary line of at least one of the first semiconductor chip or the second semiconductor chip, is oblique with respect to the boundary line.

8. The semiconductor package of claim 1, wherein the at least one first redistribution layer further comprises an additional redistribution line disposed so that a portion of the additional redistribution line overlaps the space between the first and second semiconductor chips, and the detour redistribution line and the additional redistribution line are more adjacent to each other in one portion overlapping the space between the first and second semiconductor chips than in another portion that is not overlapping the space between the first and second semiconductor chips.

9. The semiconductor package of claim 1, wherein the first semiconductor chip is composed of stacked first semiconductor chips, the second semiconductor chip is composed of stacked second semiconductor chips, and a portion of the detour redistribution line does not overlap the first semiconductor chips, and does not overlap the second semiconductor chips.

10. The semiconductor package of claim 9, further comprising:

a second redistribution structure having a structure in which at least one second redistribution layer and at least one second insulating layer are alternately stacked on each other;

an embedded semiconductor chip disposed between the first and second redistribution structures;

conductive vias electrically connecting the first and second redistribution structures to each other; and an encapsulant disposed between the first and second redistribution structures and encapsulating the embedded semiconductor chip.

11. A semiconductor package, comprising:

a first redistribution structure having a structure in which at least one first redistribution layer and at least one first insulating layer are alternately stacked on each other;

a first semiconductor chip disposed on the first redistribution structure;

a second semiconductor chip disposed on the first redistribution structure;

bumps disposed between the first redistribution structure and the first semiconductor chip and between the first redistribution structure and the second semiconductor chip;

a second redistribution structure having a structure in which at least one second redistribution layer and at least one second insulating layer are alternately stacked on each other;

an embedded semiconductor chip disposed between the first and second redistribution structures;

conductive vias electrically connecting the first and second redistribution structures to each other; and an encapsulant disposed between the first and second redistribution structures and encapsulating the embedded semiconductor chip, wherein the at least one first redistribution layer includes a detour redistribution line in which a portion of the detour redistribution line overlaps a space between the first and second semiconductor chips, wherein the detour redistribution line circuitously extends across the space between the first and second semiconductor chips so as not to overlap a stress concentration region partially overlapping a portion of one flank of the space between the first and second semiconductor chips, or extends into the stress concentration region, wherein at least one of the bumps is disposed in the stress concentration region in the space, wherein the detour redistribution line has a first portion extending in a direction parallel to a boundary line of the first and second semiconductor chips, and wherein an end of the first portion of the detour redistribution line is connected to the bumps in the stress concentration region through a first redistribution via penetrating the at least one first insulating layer.

12. The semiconductor package of claim 11, wherein the first semiconductor chip is composed of stacked first semiconductor chips, the second semiconductor chip is composed of stacked second semiconductor chips, and a portion of the detour redistribution line does not overlap the first semiconductor chips, and does not overlap the second semiconductor chips.

13. The semiconductor package of claim 12, wherein the portion of the detour redistribution line, overlapping the space between the first semiconductor chips and the second semiconductor chips, also overlaps the embedded semiconductor chip.

14. The semiconductor package of claim 13, further comprising:

a core insulating layer disposed between the first and second redistribution structures and at least partially surrounding the embedded semiconductor chip and at least a portion of the encapsulant, wherein the conductive vias are disposed in the core insulating layer, and at least a portion of the stress concentration region overlaps a portion of the core insulating layer.

15. The semiconductor package of claim 14, wherein the bumps are electrically connecting one of the first semiconductor chips and the first redistribution structure to each other and electrically connecting one of the second semiconductor chips and the first redistribution structure to each other, wherein the stress concentration region overlaps an outermost bump of the bumps, and wherein the outermost bump overlaps the space between the first and second semiconductor chips.

16. The semiconductor package of claim 15, wherein the at least one first redistribution layer further comprises an additional redistribution line disposed so that a portion of the additional redistribution line overlaps the space between the first semiconductor chips and the second semiconductor chips, and the detour redistribution line and the additional redistribution line are more adjacent to each other in one portion overlapping the space between the first semiconductor chips and the second semiconductor chips than in another portion that is not overlapping the space between the first and second semiconductor chips.

17. The semiconductor package of claim 11, wherein the detour redistribution line has a shape in which an extending direction is bent at a portion overlapping the space between the first and second semiconductor chips.

18. A semiconductor package, comprising:

a first redistribution structure in which at least one first redistribution layer and at least one first insulating layer are alternately stacked on each other;

first semiconductor chips disposed on a first surface of the first redistribution structure and stacked thereon;

second semiconductor chips disposed on the first surface of the first redistribution structure and stacked thereon;

a second redistribution structure in which at least one second redistribution layer and at least one second insulating layer are alternately stacked on each other;

an embedded semiconductor chip disposed between the first and second redistribution structures;

conductive vias electrically connecting the first and second redistribution structures to each other; and an encapsulant disposed between the first and second redistribution structures and encapsulating the embedded semiconductor chip, wherein the at least one first redistribution layer includes a detour redistribution line having one or more bends disposed in which a portion of the detour redistribution line overlaps a space between the first semiconductor chips and the second semiconductor chips, wherein the at least one first redistribution layer further includes an additional redistribution line disposed so that a portion of the additional redistribution line overlaps the space between the first semiconductor chips and the second semiconductor chips, the additional redistribution line having a straight shape, and wherein the detour redistribution line and the additional redistribution line are more adjacent to each other in one portion overlapping the space between the first semiconductor chips and the second semiconductor chips than in another other portion that is not overlapping the space between the first and second semiconductor chips.

19. The semiconductor package of claim 18, further comprising:

a core insulating layer disposed between the first and second redistribution structures and at least partially surrounding the embedded semiconductor chip and at least a portion of the encapsulant; and bumps electrically connecting one of the first semiconductor chips and the first redistribution structure to each other, or electrically connecting one of the second semiconductor chips and the first redistribution structure to each other.

20. The semiconductor package of claim 1, wherein the first redistribution layer further includes an additional redistribution line having a straight shape.

* * * * *